(12) United States Patent
Iijima

(10) Patent No.: US 6,252,409 B1
(45) Date of Patent: Jun. 26, 2001

(54) DIRECTIONAL SHORT CIRCUIT DETECTION SYSTEM AND METHOD

(76) Inventor: Akira Iijima, 20909 Norwalk Blvd. #24, Lakewood, CA (US) 90715-1550

( * ) Notice: Subject to any disclaimer, the term of this patent is extended or adjusted under 35 U.S.C. 154(b) by 0 days.

(21) Appl. No.: 09/246,891

(22) Filed: Feb. 8, 1999

(51) Int. Cl.[7] .................................................. G01R 31/28
(52) U.S. Cl. ........................ 324/529; 324/750; 361/78
(58) Field of Search .................................. 324/529, 512, 324/521, 750; 361/78, 80, 83, 93.6

(56) References Cited

U.S. PATENT DOCUMENTS

| | | | |
|---|---|---|---|
| 3,904,839 | 9/1975 | Peoples | 179/175.3 F |
| 4,251,766 | 2/1981 | Souillard | 324/52 |
| 4,387,337 | 6/1983 | Beeman | 324/52 |
| 4,518,911 | 5/1985 | Cass | 324/52 |
| 4,546,309 | 10/1985 | Kang et al. | 324/52 |
| 5,210,498 | 5/1993 | Paananen | 324/529 |
| 5,428,295 | 6/1995 | Beeman | 324/529 |
| 5,621,600 | 4/1997 | Iijima | 361/93 |

*Primary Examiner*—Safet Metjahic
*Assistant Examiner*—Jermele M. Hollington

(57) ABSTRACT

A unique system has been provided to precisely locate the exact position of a short along a conductor, even if the conductor is co-located with other conductors, even conductors connected to low resistance loads. A combination of low frequency test pulse signals, at low duty cycles, and the use of a directional sensor made with shields, account for accuracy and reliability of the system. The shields are arranged to optimally shield and direct signals at the transmitter test signal frequency. The shields also acts to place the shorted wire an optimal distance from the sensor. A method of short circuit location, using the direction sensor of the above-mentioned detection system, is also provided.

20 Claims, 12 Drawing Sheets

MIDDLE SHIELD

DIRECTIONAL SHORT CIRCUIT DETECTION SYSTEM AND METHOD

BACKGROUND AND SUMMARY OF THE INVENTION

The present invention is generally related to electrical test equipment and, more particularly to a system and method of identifying the location of a short circuit in an electrical conductor, such as a wire.

Many failures associated with electrical systems are due to problems in wiring or electrical connections. A common wire failing is a "short". A short occurs when the insulation between wires becomes chaffed or broken, allowing the wires the contact each other or the chassis.

Wires can be difficult to detect, especially if the wire is not accessible, or covered by other wires in the wire harness. An ohmmeter is used to measure the resistance between points, and can be used to detect if a wire is shorted. However, it is difficult to use an ohmmeter to determine the exact location of a short.

One common technique to trace the path of a wire involves the introduction of an a.c. signal to the wire under test. An inductive type sensor is then used with a meter or other indicator to locate the wire. The sensor is susceptible to fields generated in the wire. By correlating the position of the sensor and the indicator signal, the operator is able to trace the path of current flow and, therefore, the path of the wire.

Previous inductive sensor systems have used audio, or even higher frequency signals to generate the fields in the wire under test. However, the stray capacitance can couple between the wire under test, and shields, or other objects in the vicinity. This coupling of signals can be a problem with higher frequency signals and leads to unreliable field detection. While is may be easy to determine the general location of the wire under test when its field is coupled into surrounding objects, this stray capacitance makes the precise location of the wire under test difficult.

The identification of short circuits is a problem closely related to the location of wires. A shorted wire carries the test signal from the test signal transmitter to the point where it is shorted. Generally, the exact location of the short must be determined before it can be repaired.

Even when the location of a short is identifiable, accurate detection of the exact location of a short in a conductor can be difficult. Accurate detection is especially difficult when many wires are in close contact, such as in a wire bundle or wire harness. Then, some wires may radiate magnetic fields, in response to the conduction of current. Other, closely situated, wires may become susceptive to the radiated fields, and conduct current in response to the magnetic field. Thus, a short in one wire induces the appearance of a short in a neighboring wire. Likewise, signal currents may appear as shorts to the short detection equipment. Further, the resistance associated with electrical motors and light bulbs, for example, is so low that wire connected to these types of devices may appear to be shorted.

In general, large wattage light bulbs have a lower resistance than more smaller, low wattage light bulbs. Electrical motors have a higher resistance than light bulbs. Light bulbs and electrical motors are liable to give a short detector a false indication of a short circuit. Thus, if a short detector is placed closer to an electrical line connected to a light bulb, than to the wire with the actual short. The detector may falsely determine that the short is in the wire connected to the light bulb.

Other factors affect the accuracy of determining a short in a conductor. A wire that is well-shorted, having a low resistance to ground, is relatively easy to identify. A wire that is shorted with a larger resistance to ground is more difficult to detect. Also, shorts in wires associated with devices that consume large amounts of power are difficult to accurately identify. Ideally, a line with no short should also be easy to identify. That is, a line with no short should not generate a false detection of a short. However, as mentioned above, the resistance of the device connected to the wire under test in critical in the accuracy of measuring shorts.

A relative ranking of short identification, or accuracy with respect to the electrical device attached to the wire under test follows:

TABLE 1

| DEVICE | ACCURACY |
| --- | --- |
| 12 volt radio | >90% |
| 12 volt relay | >90% |
| 12 volt, 10 watt light bulb | approximately 80% |
| 12 volt, 120 watt motor | approximately 75% |
| 12 volt, 20 watt light bulb | approximately 70% |
| 12 volt, 55 watt light bulb | approximately 65% |

Akira, in U.S. Pat. No. 5,621,600, discloses a portable apparatus to locate shorts in a conductor. The system uses a transmitter to generate a test signal. Current induced by the test signal through the conductor creates a magnetic field. A sensor/receiver locates the short by moving the sensor along the conductor under test, while looking for discontinuities in the field readings. While the system is effective, stray fields sometimes make the precise location of a short difficult.

It would be advantageous if a system and method were developed which used a test signal frequency and pulse width which optimized identification of the wire under test. It would be advantageous if the test signal frequency and pulse width increased the accuracy of the identification of shorted wires.

It would be advantageous if an inductive field sensor could be modified to be less susceptible to the load on a conductor, when testing the conductor for a short.

It would be advantageous if a field detector circuit could be optimally positioned with respect to a conductor under test to optimize the accuracy of readings when testing the conductor for the location of a short.

Accordingly, A system for detecting the location of a low resistance short in a conductor is provided. The system uses a transmitter to generate a test signal having a low duty cycle pulse. This transmitter has an output connected to the conductor under test, to introduce the test signal to the conductor under test.

The system also uses a hand-manipulable detector to sense magnetic fields along the conductor, induced by the transmitted test signal. This detector has an output with a test receive signal that is responsive to the transmitted test signal magnetic fields. In turn, a receiver, having an input operatively connected to the detector output of the detector, is responsive to the test receive signal. A receiver output signal, detectable by the operator, permits the detector to be operated in response to the receiver output. That is, the detector operator is able to guide the detector to the point of maximum response, as indicated by the receiver output.

The key to the new short detection system is the increased accuracy and reliability of the readings afforded with the use of a detector shield. Center shield walls, at least partially, surround the detector. An opening in the shield walls exposes the detector. The detector shield minimize the influence of magnetic fields on the detector when the shield walls are interposed between a magnetic field and the detector. The shields maximize the influence of a magnetic field on the detector when the opening is interposed between a magnetic field and the detector. In this manner, a short in a conductor is precisely located through the use of the detector shield in conjunction with the receiver output.

Besides minimizing unintended fields, the shield structure has another primary function, it optimally locates the position of the detector from the conductor under test. By maintaining a predetermined distance between the conductor and the detector, the reliability of the detector readings is further enhanced. The detector center shield walls generally have the shape of a channel, with a channel mouth. The detector center shield is shaped to locate the conductor a minimum first distance from the detector, and a maximum second distance from the detector. In this manner, the test signal transmitted from a conductor is optimally sensed when the detector shield mouth is interposed between the conductor and said detector.

The spacing is maintained with the use of a non-conductive spacer, typically plastic, interposed a first distance from the detector, to maintain a minimum first distance between the conductor and the detector. The channel shape of the shields helps insure that the wires under test are placed in the shield mouth within the second distance. The spacer prevents the wires from getting too close to the detector, further than the second distance. The first distance is approximately 17 millimeters (mm), and the second distance is approximately 42 mm.

The detector shields also include shields auxiliary to the center walls. Middle shield interior wall surfaces are located adjacent the exterior surfaces of the center walls. Likewise, outer shield interior wall surfaces are located adjacent the middle shield wall exterior surfaces. The addition shield walls increase the reliability of detector readings by minimizing the detection of fields away from the shield mouth section. The use of three, properly integrated, thin-walled shields is more efficient than the use of one or two thicker shields.

The middle and outer shield walls have a thickness in the range from approximately 0.4 to approximately 0.6 mm, while the center wall thickness is approximately 0.8 mm. Naturally, the thickness is dependent on the shield wall material. Preferably, the shield wall material is selected from the group of materials consisting of ferrous metal, aluminum, and transformer iron. Preferably, the center shield is aluminum.

A method for improving accuracy in the identification of shorts in a conductor is also provided comprising the steps of:
 a) introducing an extremely low duty cycle (approximately 0.17%, or greater), extremely low frequency (approximately 2 Hz), pulse transmitter test signal to the conductor under test, whereby the conductor radiates a field in response to the test signal;
 b) while maintaining an optimal separation between the detector and the conductor under test, detecting a plurality of fields, radiated by the transmitter test signal in the conductor under test, in response to a corresponding plurality of positions along the conductor. A detector shield minimizes the influence of fields on the detector when the shield walls are interposed between a field and the detector, and maximizes the influence of a magnetic field on the detector when the opening is interposed between a magnetic field and the detector;
 c) comparing the plurality of fields detected in Step b) to determine a change in detected fields; and
 d) establishing a correspondence between change of field detected in Step c) and a position along the conductor under test, whereby the change of field indicates a short in the conductor.

As described above, a non-conductive spacer is interposed between the detector and the detector shield mouth, and Step b) includes interposing the spacer between the conductor under test and the detector, whereby an optimal spacing is maintained for the sensing of test signals on the conductor.

BRIEF DESCRIPTION OF THE DRAWINGS

FIG. 8b is a perspective view of shield section of FIG. 8a.

DETAILED DESCRIPTION OF THE PREFERRED EMBODIMENT

As shown above in Table 1, there is a problem in identifying shorted conductors connected to low resistance loads, such as bulbs. It is understood that a shorted conductor is a conductor, such as a wire, which makes an unintended connection to ground or to another conductor. Such a shorted conductor may, or may not still be connected to its intended load. As explained below, the present invention is a closed-loop feedback system for detecting low resistance short circuits in a conductor through the continuous interaction of the system with a human operator.

Figure 1:
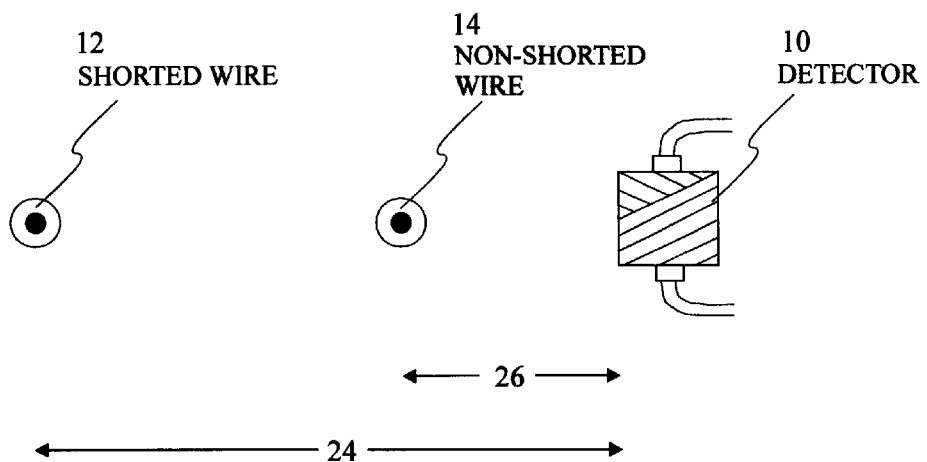
FIG. 1 illustrates a problem in identifying a shorted connector, based upon the distance of conductors from the detector.

FIG. 1 illustrates a problem in identifying a shorted connector, based upon the distance of conductors from the detector. A detector, or sensor coil 10 is placed in the vicinity of two conductors. Conductor, or wire 12 is shorted, while conductor, or wire 14 is not shorted. For example, wire 14 is operatively connected to a low resistance light bulb.

Figure 2:
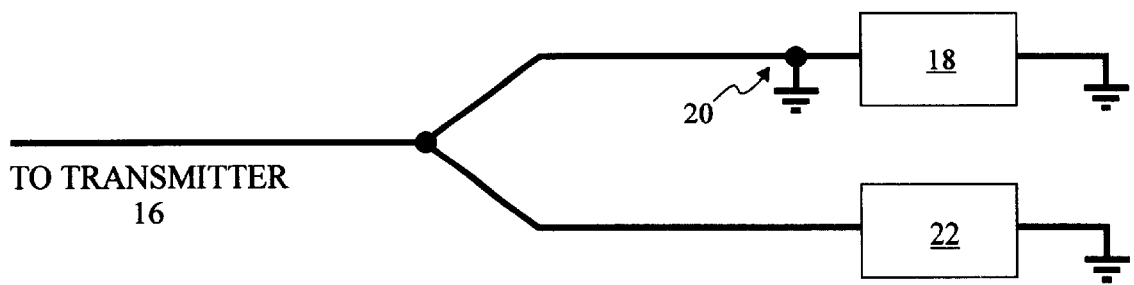
FIG. 2 illustrates the loading on the conductors of FIG. 1.

FIG. 2 illustrates the loading on conductors 12 and 14 of FIG. 1. Test signal transmitter 16, not shown, is operatively connected to both wires 12 and 14 because wires 12 and 14 have a common source. Alternately, the test signal on wire 12, the conductor under test, is unintentionally coupled into wire 14 because of the close proximity of the two wires. Wire 12 is connected to a load 18. However, there is a short, represented by reference designator 20, between load 18 and transmitter 16. Wire 14 is operatively connected to ground through low resistance load 22. A test signal radiator is formed operatively connected to stimulus generator 16 (not shown) which includes conductor under test 12 shorted to ground 20. Signal radiator 12 creates a magnetic field, responsive to the test signal current induced in electrical conductor under test 12 between stimulus generator 16 and short 20.

Returning the FIG. 1, sensor 10 is located a distance, represented by reference designator 24, from wire 12. Sensor 10 is located a distance, represented by reference designator 26, from wire 14. Because sensor 10 is located closer to wire 14, than it is to wire 12, sensor 10 may determine that wire 14 is shorted due to the presence of a detected, but unintended, test signal field. Alternately, the current flowing through wire 14 creates a field which makes the precise identification of the location of short 20 difficult. The present invention system for detecting the precise location of a low resistance short in a conductor minimizes location errors due to the placement of detector 10

The short location system includes a manipulable detector 10 to sense magnetic fields along the conductor induced by the transmitted test signal from transmitter 16. It is well known that the conduction of current in a wire generates electric and magnetic fields.

Figure 3:
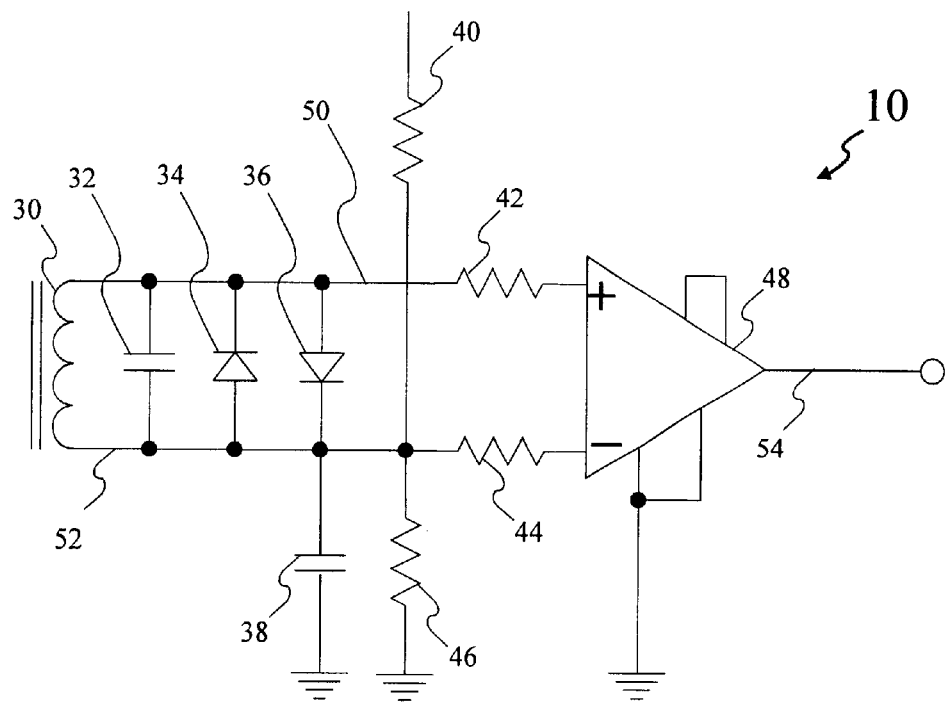
FIG. 3 is a schematic illustrating the detector of FIG. 1.

FIG. 3 is a schematic illustrating detector 10 of FIG. 1. Detector 10 includes a sensor coil, or inductor 30 and a capacitor 32 placed adjacent sensor coil 30. Associated with detector 10 are diodes 34 and 36, capacitor 38, resistors 40, 42, 44, and 46, and comparator 48. Components 32 through 48 need not be located in close proximity to detector 10. In some aspects of the invention, some of these above-mentioned parts are located in the receiver (not shown, see FIG. 6), on the other end of lines 50 and 52 from detector 10. However, locating components 32 through 48 in close proximity to detector 10 increases circuit stability. Detector 10 has a output on lines 50 and 52, which is conditioned by components 32 through 48 to generate a test receive signal which is responsive to the transmitted test signal magnetic fields. That is, the fields sensed by detector 10 are converted to a test receive signal in the receiver. In some aspects of the invention, detector 10 includes a manipulable section including coil 30 and lines 50 and 52, and a non-manipulable section whose output is the output of comparator 48 on line 54.

Figure 4:
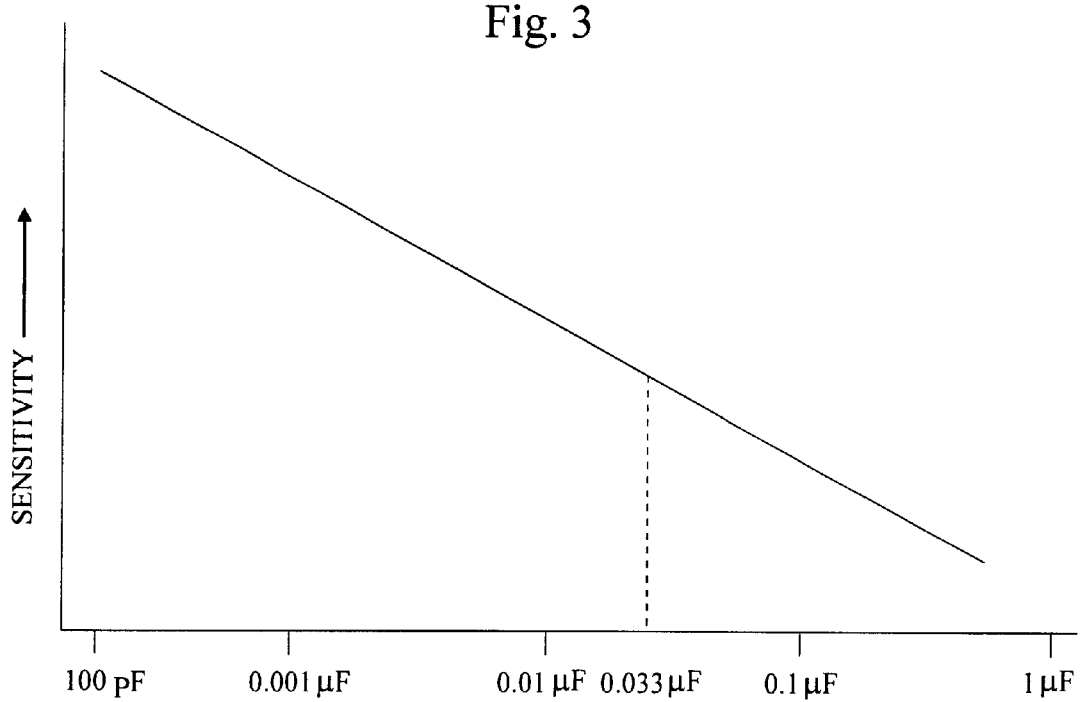
FIGS. 4 and 5 illustrate the effect of detector capacitance on the reliable detection of fields generated from the transmitter test signal in the conductor under test.
Figure 5:
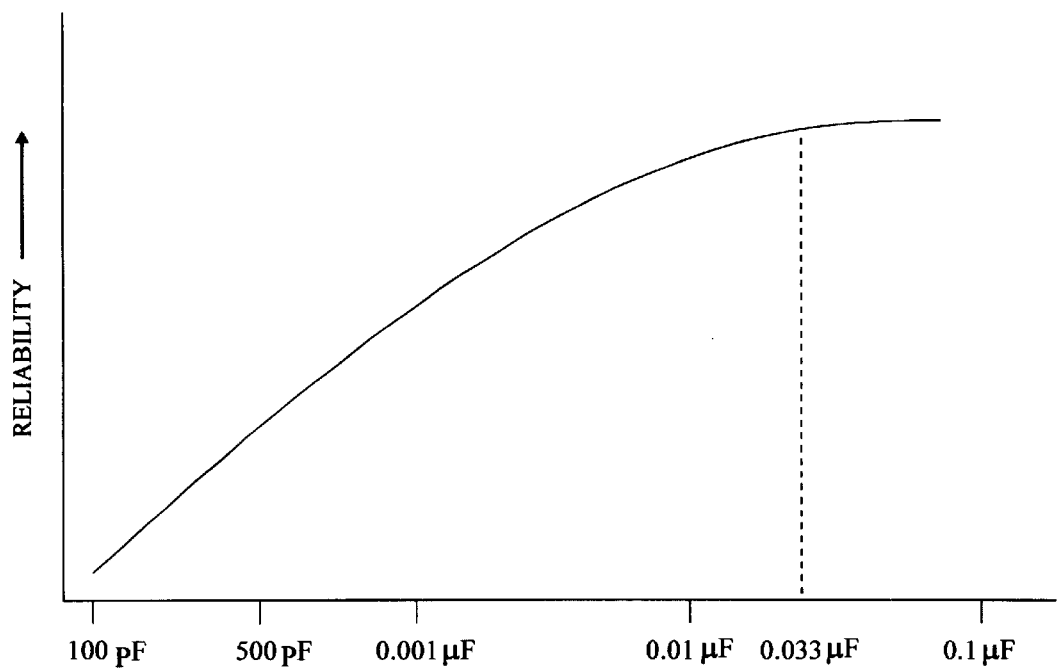

FIGS. 4 and 5 illustrate the effect of detector 10 capacitance on the reliable detection of fields generated from the transmitter test signal in the conductor under test. FIG. 4 shows that a larger capacitor value decreases the sensitivity of detector 10. FIG. 5 shows that the reliable detection of the test signal flattens out, before declining again at larger values, at a capacitance of approximately 0.033 microfarads (uF). The reliability of detection is dependent on the frequency and pulse width of the test signal used, as will be discussed below. In some aspects of the invention, detector 10 includes an inductor 30 of approximately 10,000 microhenries (uH) in parallel with capacitor 32 of approximately 0.033 uF. In some aspects of the invention, inductor 30 is an axial type iron core radio frequency (RF) choke, such as part number 70F102 Al, made by J W Miller.

Figure 6:
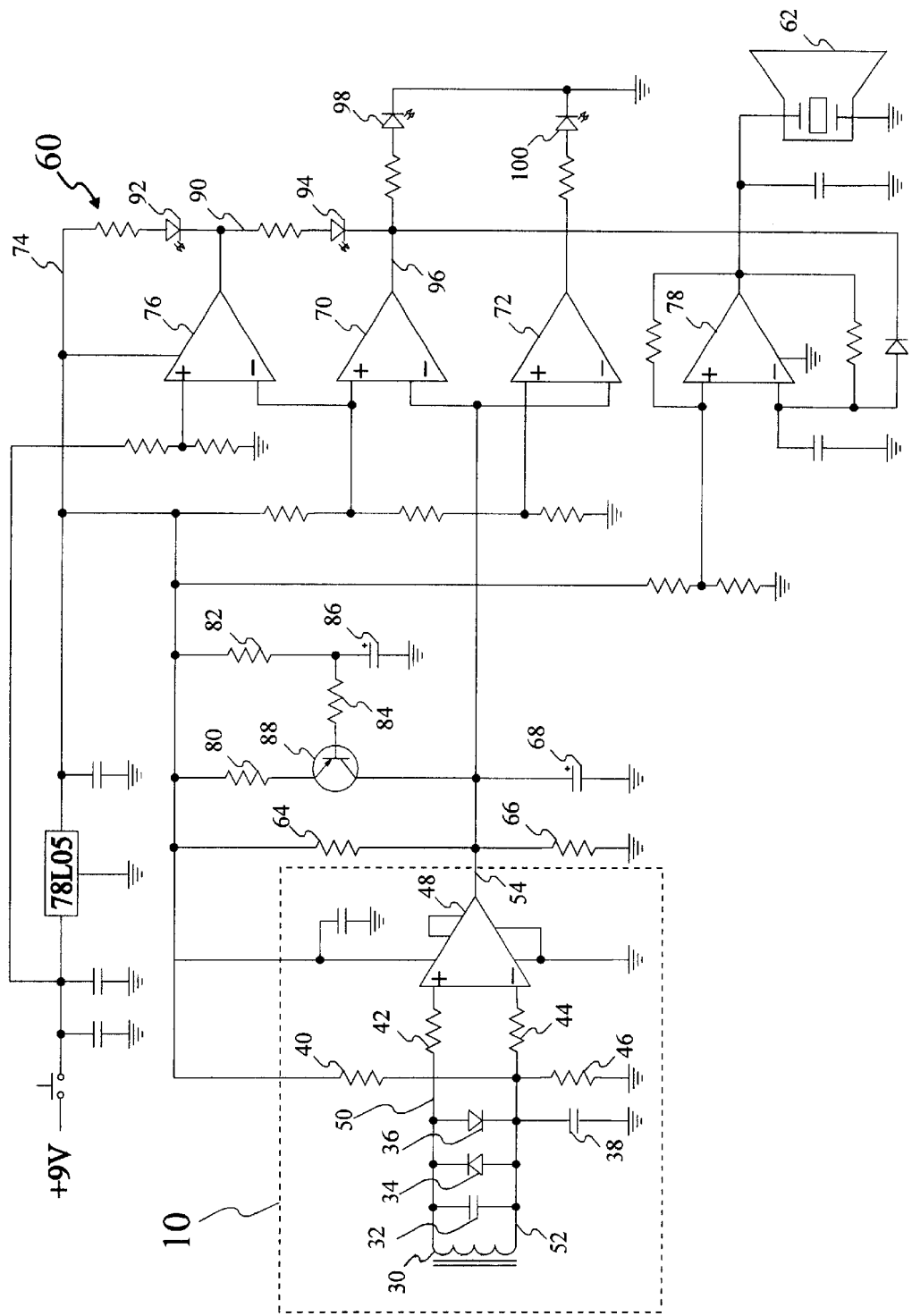
FIG. 6 illustrates a receiver having an input operatively connected to the output of the detector.

FIG. 6 illustrates a receiver 60 having an input on line 54 operatively connected to the output of detector 10 on line 54.

Receiver 60 has a receiver output from piezo element 62 responsive to the test receive signal. In this manner, detector 10 is manipulated in response to the receiver output at piezo element 62. Alternately, the receiver output is a gauge reading, LED, visual display, or even a vibrator output. Indicators that don't require the use of the operators eyes are especially useful, however.

Resistor 64, resistor 66, and capacitor 68 act to condition the signal on line 54. In some aspects of the invention, resistor 64 is 20 k ohms, resistor 66 is 45.3 k ohms, and capacitor 68 is 2.2 uF. This conditioning circuit limits the maximum voltage at the input to op amps 70 and 72. In some aspects of the invention, op amps 70 and 72 are LM 324, and the maximum voltage on line 54 must be limited to less than 3.5 volts, when a 5 volt dc supply is used for power on line 74. Typically, op amps 70, 72, 76, and 78 are all included in one integrated circuit. The conditioning circuit of resistor 64, resistor 66, and capacitor 68 permit a wide range of voltage values on lines 50 and 52. Resistors 80, 82, 84, capacitor 86, and transistor 88 charge capacitor 68, upon turn-on of receiver 60.

Receiver 60 includes a supply voltage checking circuit. One of the quad op amps of the LM 324 is shown as amplifier 76. When the supply voltage drops below 7.1 volts, the output of amplifier 76, on line 90, goes low and LED 92 turns on to warn of a low voltage condition. When the power supply is above 7.1 volts, the output of amplifier 76 goes high, causing LED 94 to light. LED 92 is the power-on/normal voltage indicator.

Op amps 70 and 72 are part of the signal indicator circuit. When a magnetic field is sensed at detector 10, the voltage on line 54 drops below approximately 3.46 volts. The output of op amp on line 96 is operatively connected to LED 98 and piezo element 62. When weak fields are detected, LED 98 lights, and piezo element 62 emits a short "beep". Op amp 72 is operatively connected to LED 100, which is turns on when a large field is detected. Also, when large fields are detected, piezo element 62 emits a longer signal.

The output of op amp 78 is operatively connected to piezo element 62. When driven from op amp 70 on line 96, op amp 78 drives piezo element 62 with an approximately 4000 Hz square wave.

Figure 7:
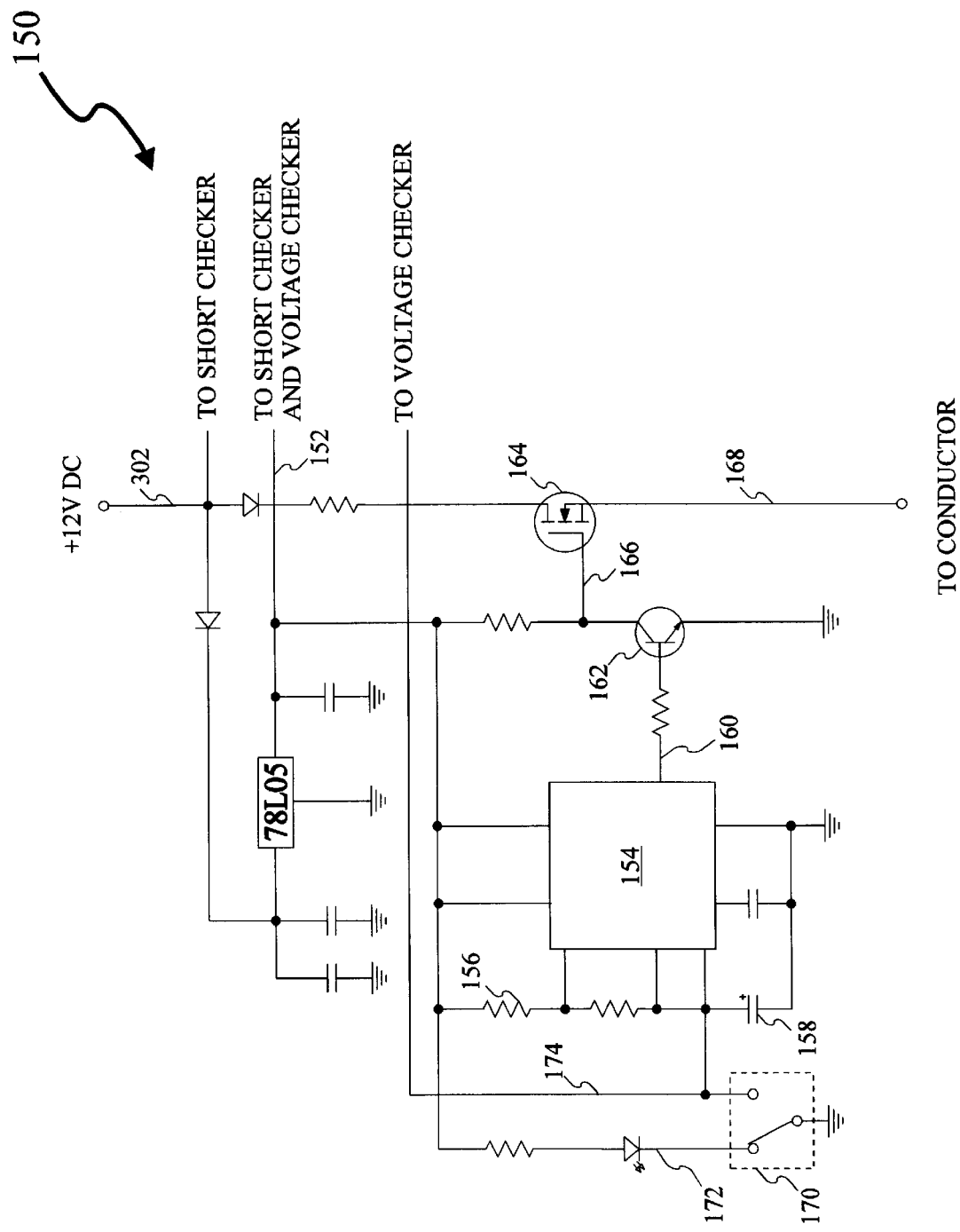
FIG. 7 is a schematic of the transmitter section of the present invention short circuit identification system.

FIG. 7 is a schematic of the transmitter section of the present invention short circuit identification system. Transmitter 150 includes a power supply which powers transmitter section 150. In the example of FIG. 7, a 78L05 voltage regulator is used to supply 5 volts on line 152 from a 12 volt source. Transmitter, or stimulus generator 150 creates a test signal to induce current in the conductor under test. Timer circuit 154 is used to generate a pulse. In the example of FIG. 7, half of a 556 timer IC is used as the pulse stimulus. Resistor 156 (750 k ohms) and capacitor 158 (1 uF) are used with timer 154 to generate an approximately 2 Hz repetition rate pulse (period of 0.5 seconds) having approximately an 85 microsecond (us) pulse width on line 160. That is, the pulse width of the test signal is a duty cycle of greater than approximately 0.02%. The invention is not necessarily limited to these repetition rates and duty cycles. In some aspects of the invention, the pulse rate varies from 0.1 to 100 Hz, and the duty cycle varies from 0.2% to 10%. The pulse train on line 160 is inverted by transistor 162. Transistor 164 is used to convert the inverted pulse train on line 166 to a signal with large enough current to generate fields. The output of transistor 164 is operatively connected to the conductor under test through line 168. Transmitter 150 generates a test signal on line 168 having a low duty cycle pulse, whereby a test signal is introduced to the conductor under test.

In normal operation, an operator first tests to see if wire under test 168 is shorted. In the on position, as shown in FIG. 7, switch 170 grounds line 172. Grounding line 172 causes timer 154 to generate transmitter test pulses. For example, when the short checker circuit (not shown) indicates a current flow of over 25 amps, the operator is alerted. The operator is then able to engage switch 170, to begin the generation of test signal pulses to the wire under test 168.

When switch 170 is in the off position, (not shown) line 174 is grounded. Grounding line 174 causes transmitter 150 to cease the generation of the transmitter test signal. This feature is useful in conditions of low transmitter supply voltage. A voltage checking circuit (not shown) operatively connected to line 174 alerts the operator and ceases the operation of timer 154 if the operating voltage is either above or below specified limits.

Figure 8A:
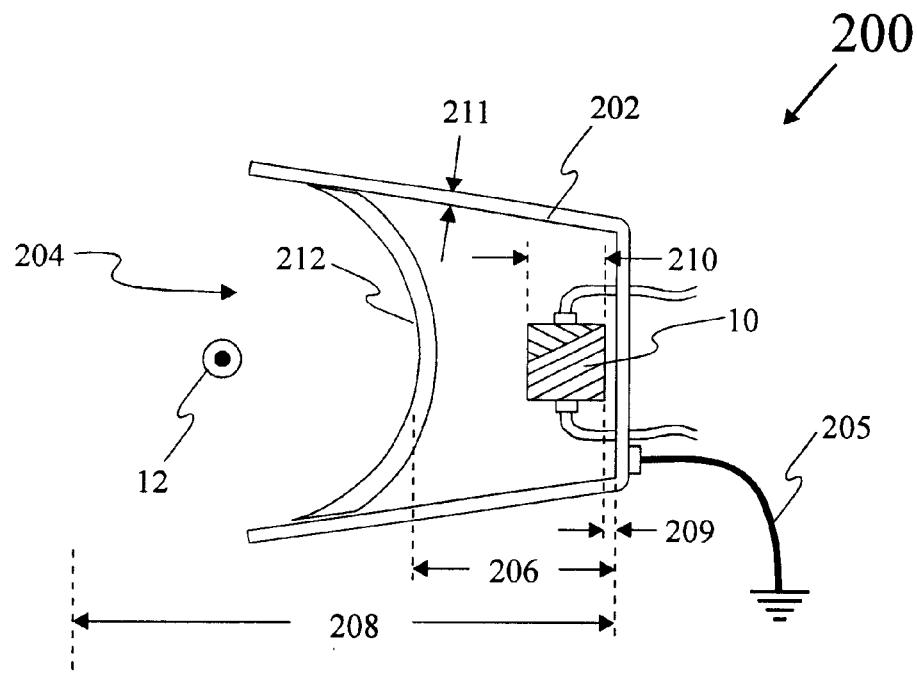
FIG. 8a illustrates the detector shield sections of the present invention.

FIG. 8*a* illustrates the directional detector shield sections of the present invention. The key element of the invention, which permits the present invention detection system to more reliably identify and precisely locate shorts in a conductor under test, is the detector shield sections. With shielding, receiver 60, and detector 10 become a directional sensor to receive the magnetic field with a first strength in a first directional orientation. A second strength, less than the first strength, is received in a second directional orientation. That is, as explained in more detail below, the field is received in the first orientation better than it is received in the second orientation. As explained above, directional sensor 60 generates a field indicator signal, detectable to the human operator, in response to the strength of the received magnetic signal.

The operator manipulates directional sensor 60 with respect to conductor under test 12 to generate a plurality of field indicator signals corresponding to the location of directional sensor 60 with respect to conductor under test 12. In this manner, the operator is able to accurately locate of the short in conductor under test 12.

Detector shield 200 has center shield walls 202 at least partially surrounding detector 10. An opening 204 in shield walls 202 exposes detector 10. Detector shield 200 minimize the influence of magnetic fields on detector 10 when shield walls 202 are interposed between a magnetic field and detector 10. Shields 202 maximize the influence of a magnetic field on detector 10 when opening 204 is interposed between a magnetic field and detector 10. This is the first orientation of directional sensor 60. When opening 204 is not interposed between a magnetic field and detector 10, direction sensor 60 is in the second orientation. In this manner, a short in a conductor is precisely located through the use of detector shield 200 in conjunction with the receiver output. A conductor 205 operatively connects center shield wall 202 to receiver circuit 60 ground.

As shown in FIG. 8*a*, detector shield 200 has center shield walls 202 generally in the shape of a U-shaped channel, with a channel mouth 204. Center shield 202 is shaped to locate conductor 12 a minimum first distance 206 from detector 10 and a maximum second distance 208 from detector 10. That is, the shape of shield 202 is formed to, at least partially, maintain an optimal distance between conductor under test 12 and detector 10. The test signal transmitted from conductor 12 is optimally sensed when the detector shield mouth 204 is interposed between the conductor and said detector. As shown in FIG. 8*a*, distances 206 and 208 are defined from the bottom the shield channel underlying detector 10. The sensitivity of detector 10 is influenced by the distance detector 10 is separated from the bottom of the shield channel. This distance is represented by reference designator 209. The width of detector 10 is represented by reference designator 210.

In some aspects of the invention, detector shield center walls 202 are selected from the group of materials consisting of aluminum, ferrous metals, and transformer iron, and walls 202 have a thickness 211 greater than approximately 0.8 millimeters. As is well understood, ferrous metals include a wide variety of metals having high permeability with respect to fields of energy. Such magnetic materials include metals from the group consisting of Supermalloy, Permendur, Mu metal, and various grades of Permalloy.

Detector shield 200 further includes a non-conductive spacer 212 interposed to maintain the first minimum distance 206 between conductor 12 and detector 10. The concave shape of spacer 212, together with center shield walls 202, form an area which easily accepts a wire, conductor, or wire harness bundle. In this manner, conductor under test 12 is kept within the optimum sensing area defined by minimum distance 206 and maximum distance 208. In some aspects of the invention, first distance 206 is in the range from about 10 to 30 millimeters (mm), and second distance 208 is in the range from about 30 and 50 mm. In some aspects of the invention, detector 10 has a width 210 of approximately 8 mm, and has a channel separation 209 of approximately 1.5 mm. Optimally, first distance 206 is approximately 17 mm, and second distance 208 is approximately 42 mm.

As seen in FIG. 8*a*, spacer 212 has a concave shape which receives a wire harness, including conductor under test 12. The placement of spacer 212 in channel mouth 204, a predetermined distance from detector 10 acts to place conductor under test 12 in a directionally enhanced sensing area for detector 10. Further, spacer 212 does not permit conductor under test 12 from getting too close. Simultaneously, the concave shape of spacer 212 encourages the user to place spacer 212 against conductor 12 so that conductor 12 is not too far away from detector 10. Shield section 200, therefore, acts to directionally focus any fields generated by conductor 12, while maintaining an optimal distance from sensor 10. All these factors tend to improve the accuracy and reliability of the fields readings.

Inductor 30 of detector 10 (see FIGS. 3 and 6) is an omni-directional field sensor. When many conductor are closely located with the conductor under test, such an omni-directional sensor has difficulty precisely locating a short. Shield walls 202 help make detector 10 directional in a simple, cost effective manner. The sensing area defined by mouth 204 becomes much smaller. Aluminum and iron make a good shield material, however, iron is heavy. Therefore, aluminum is the preferred material. A shield thickness of approximately 0.8 mm is effective. The beneficial effects of increased thicknesses are not significant after 1 mm, while the cost is a heavier shield/detector unit.

Figure 8B:
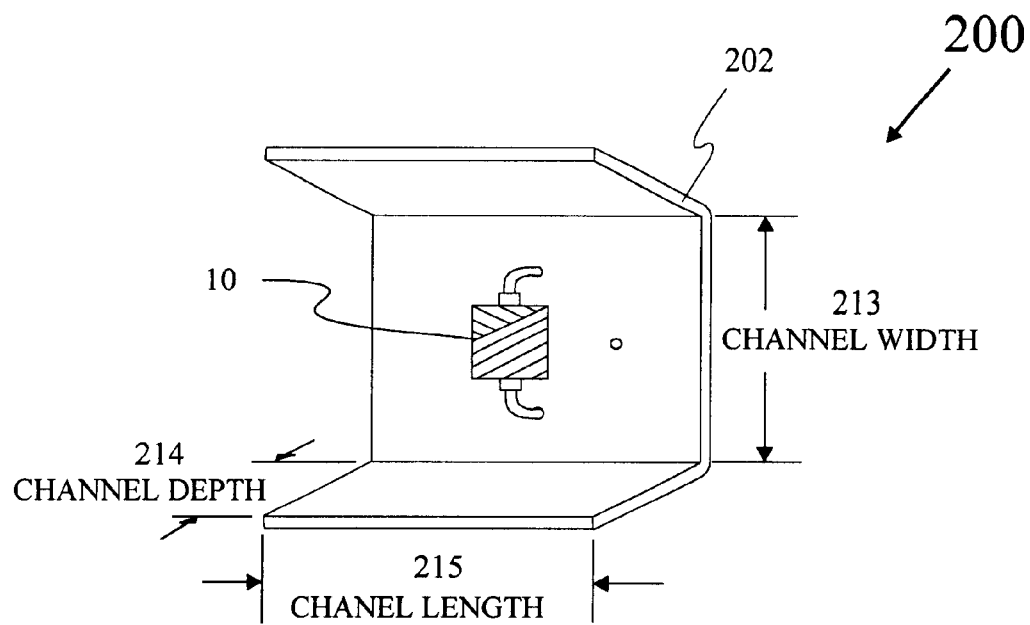

FIG. 8*b* is a perspective view of shield section 200 of FIG. 8*a*. Center shield 202 has a channel width 213, a channel depth 214, and a channel length 215. The distance between detector 10 and spacer 212 (not shown) is proportional to signal strength and sensitivity. A shorter channel depth 214, wider channel width 213, and shorter channel length 215 all act to increase the sensitivity of the test fields received by sensor 10. However, an increase of sensitivity typically comes at the price of decreased shielding and lower reliability. Although any number of combinations exist to define the elements of detector 10, and size of shield 202, the values given herein represent a workable compromise between sensitivity and reliability.

Figure 9:
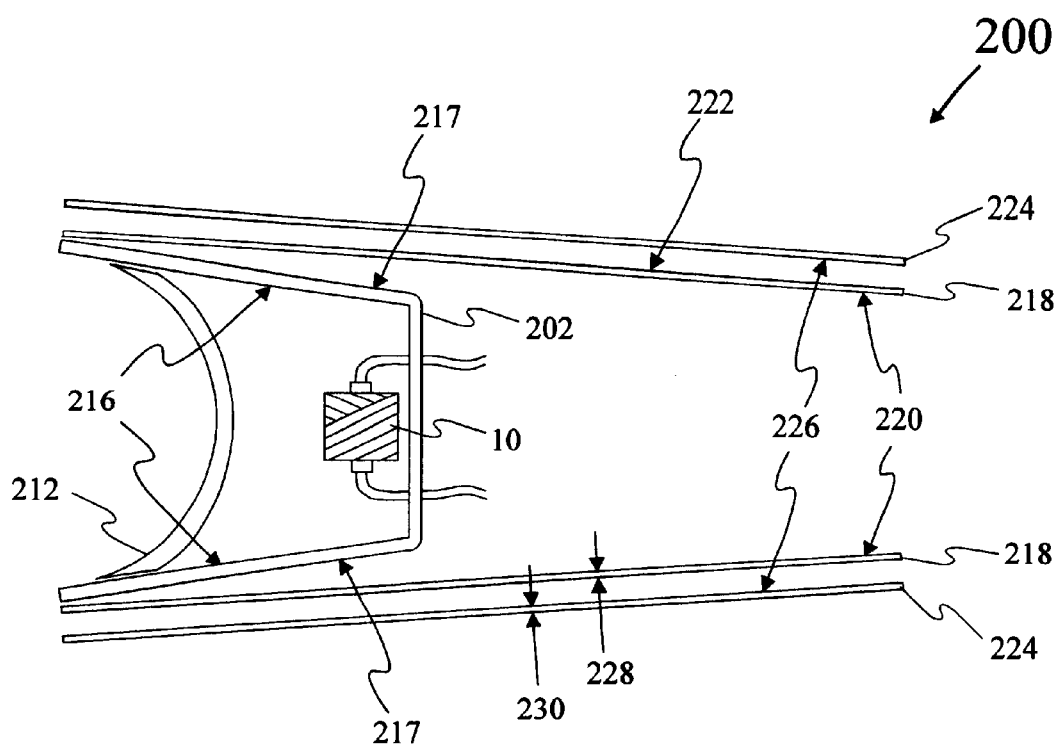
FIG. 9 illustrates auxiliary shield sections used in some aspects of the present invention.

FIG. 9 illustrates auxiliary shield sections used in some aspects of the present invention. Shield center walls 202 have an interior wall surface 216 adjacent detector 10 and an exterior wall surface 217. Two middle shield walls 218 each have an interior wall surface 220 located adjacent each exterior center wall surface 217. Each middle shield wall 218 also has an exterior wall surface 222. Two outer shields walls 224 each have an interior wall surface 226 located adjacent middle shield exterior wall surfaces 222. In some aspects of the invention, the above-mentioned shielding sections are spaced approximately 2–3 mm from each other.

In some aspects of the invention, middle 218 and outer 224 shield walls have thicknesses 228 and 230, respectively. Thicknesses 228 and 230 are in the range from approximately 0.4 to approximately 0.6 mm. Middle 218 and outer 224 shield wall material is selected from the group of materials consisting of ferrous metal, aluminum, and transformer iron. Ordinary iron sheet metal also makes an effective shield.

Figure 10A:
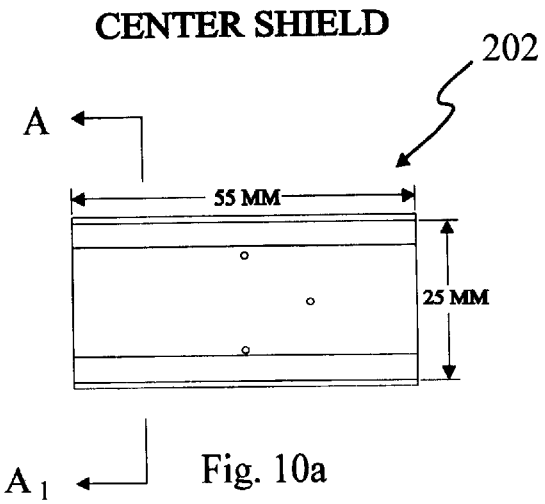
FIGS. 10a through 10f illustrate the center shield, middle shield, and outer shield.
Figure 10B:
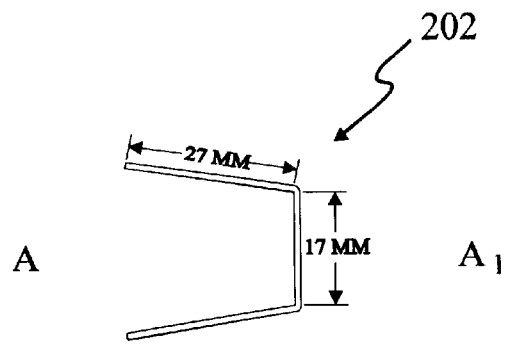
Figure 10F:
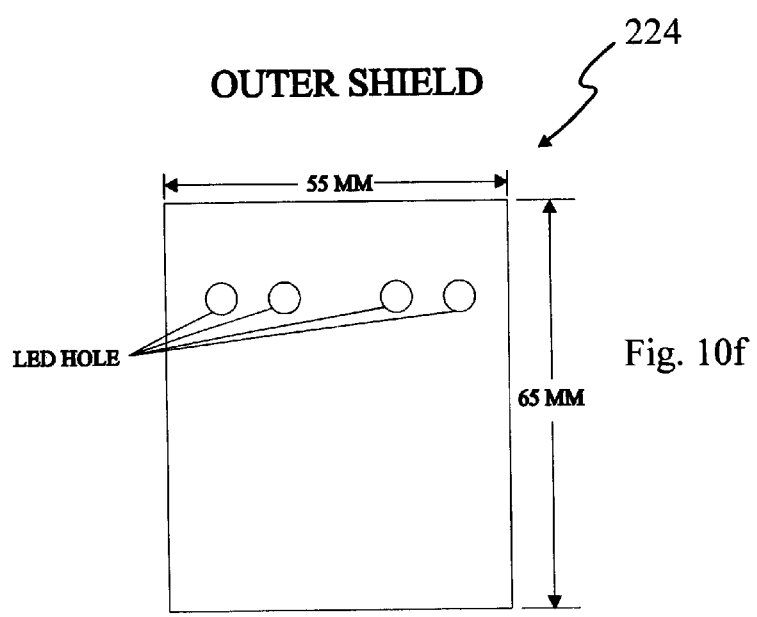
Figure 10C:
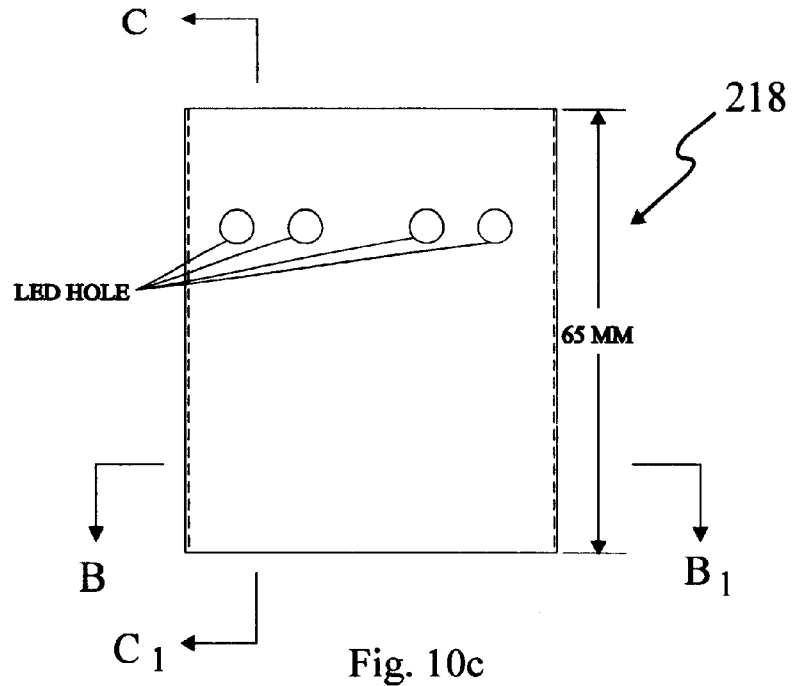
Figure 10D:
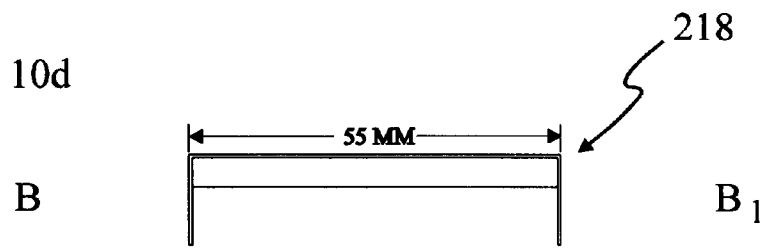
Figure 10E:
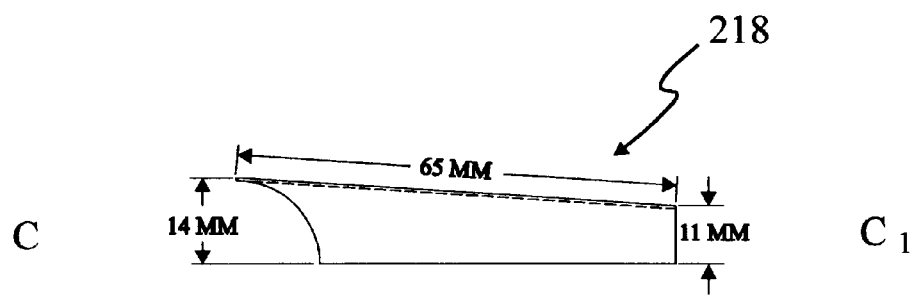

FIGS. 10a through 10f illustrate the center shield 202, middle shield 218, and outer shield 224. More particularly, FIG. 10a is a plan view of the center shield 202, and FIG. 10b is a partially cross-sectional view of FIG. 10a. FIG. 10c is a plan view of middle shield 218, and FIGS. 10d and 10e are partial cross-sectional views of FIG. 10c. FIG. 10f depicts outer shield 224. Example dimensions for above-mentioned shield walls 202, 218, and 224 are given in FIG. 10.

Figure 11:
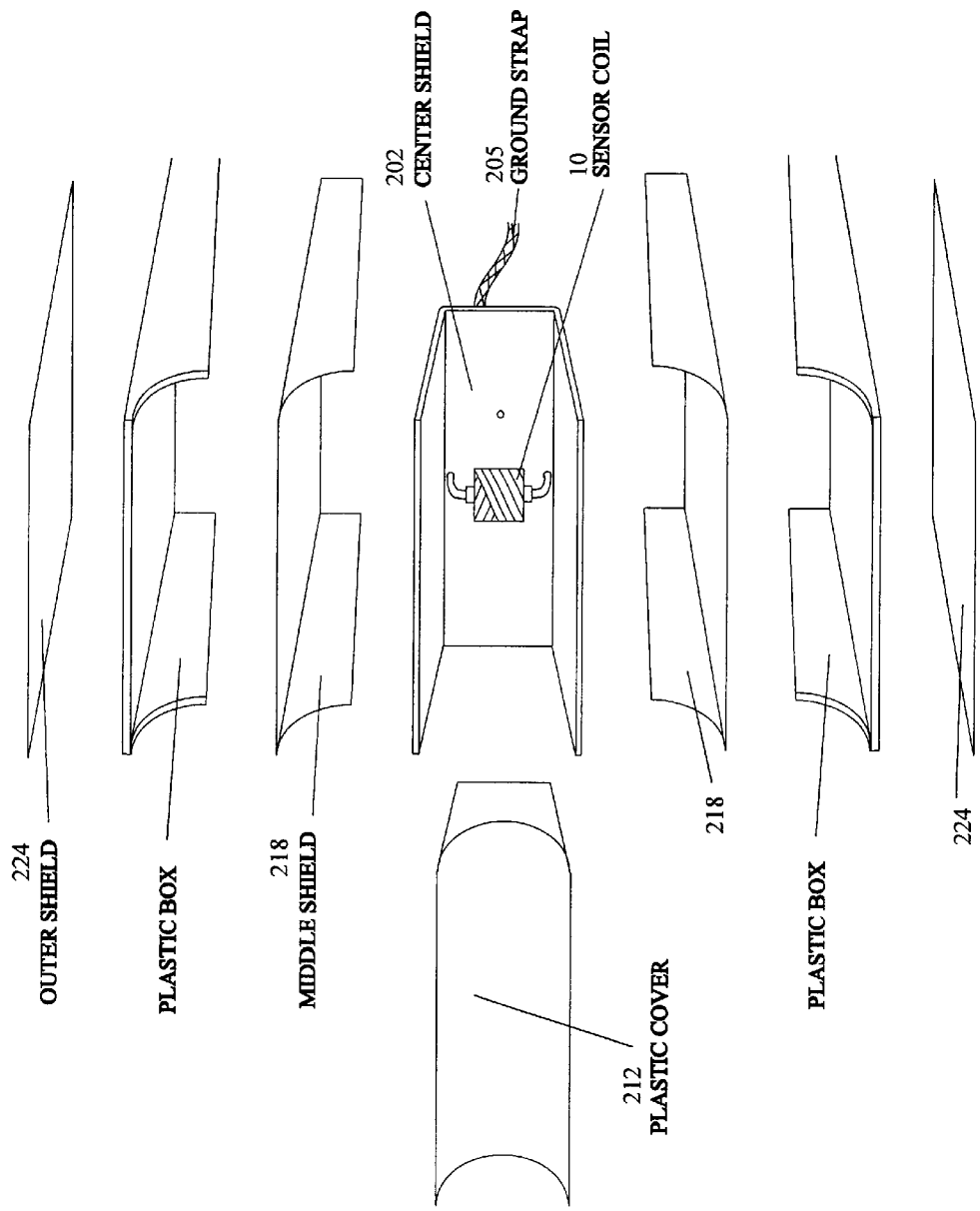
FIG. 11 illustrates an assembly example of the shields of FIG. 10.

FIG. 11 illustrates an assembly example of shields 202, 218, and 224 of FIG. 10.

Figure 12:
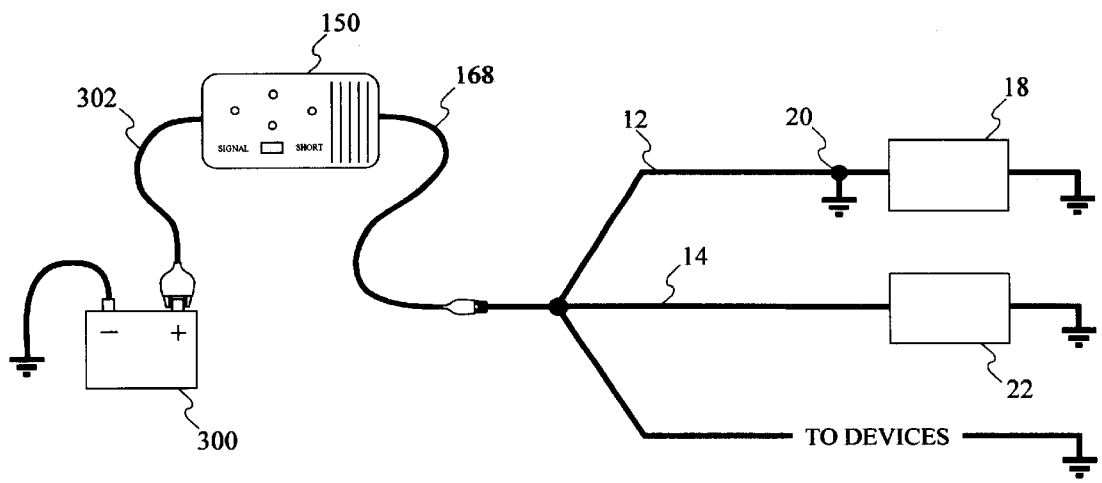
FIG. 12 illustrates the connection of the transmitter to the conductor under test.

FIG. 12 illustrates the connection of transmitter 150 to the conductor under test. Transmitter 150 is powered from an external battery, such as car battery 300, and is operatively connected to battery 300 with conductor 302. In some aspects of the invention, a battery (not shown) is internally incorporated into transmitter 150.

Figure 13:
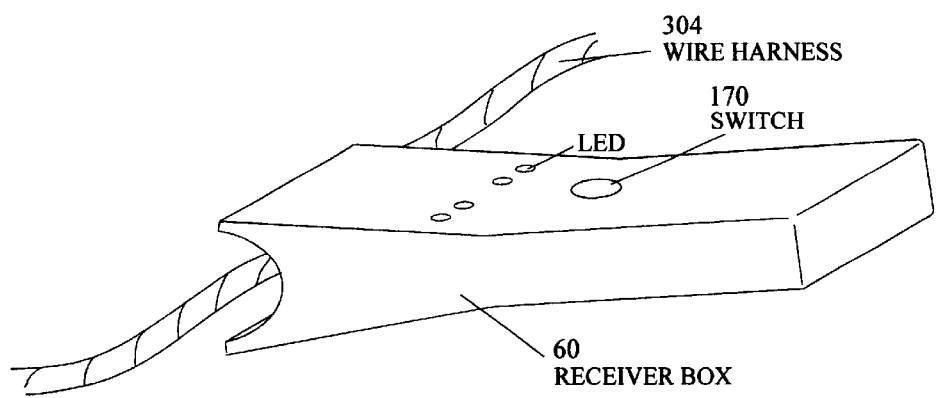
FIG. 13 illustrates the testing of a wire harness, including conductors.

FIG. 13 illustrates the testing of a wire harness 304, including conductor 12 and 14. Receiver 60 is incorporated in the same chassis as shields 202, 218, and 224 (see FIGS. 8 through 11), as well as detector 10.

Figure 14:
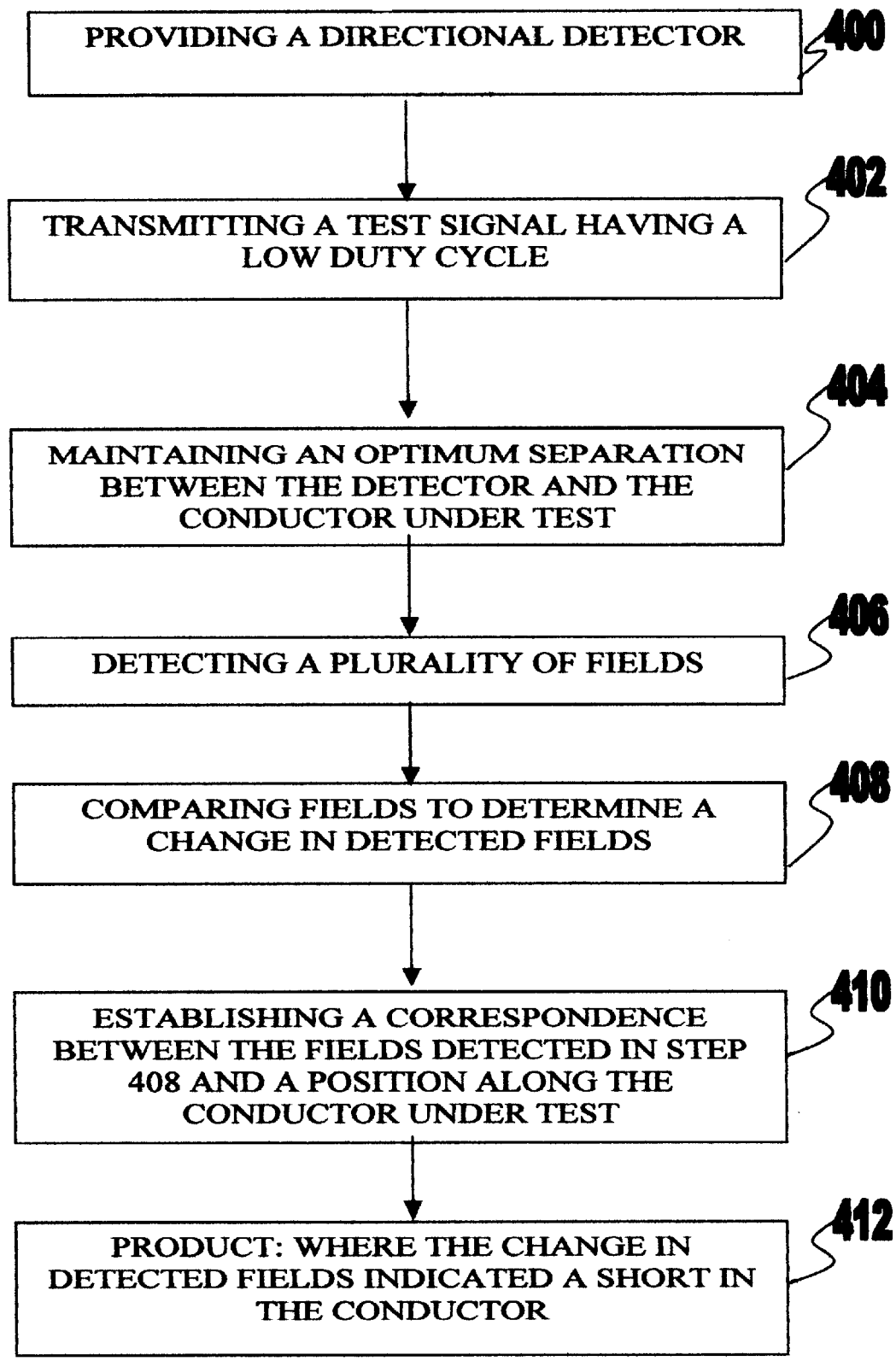
FIG. 14 illustrates a flowchart for a method of improved accuracy in the identification of shorts in a conductor.

FIG. 14 illustrates a flowchart for a method of improved accuracy in the identification of shorts in a conductor. Step 400 provides a directional detector. In some aspects of the invention, the directional detector includes an inductor of approximately 10,000 uH in parallel with a capacitor of approximately 0.033 microfarads. Step 402 introduces a low duty cycle pulse transmitter test signal to the conductor under test, whereby the conductor radiates a field in response to the test signal. In some aspects of the invention, Step 402 includes using a transmitter test signal pulse width having a duty cycle of greater than approximately 0.02%. When the pulse repetition rate is approximately 2 Hz, then the pulse width is approximately 85 microseconds.

Step 404 maintains an optimal separation between the detector and the conductor under test, whereby the accuracy of the field readings is improved. Step 406 detects a plurality of fields, radiated by the transmitter test signal in the conductor under test, in response to a corresponding plurality of positions along the conductor. Step 408 compares the plurality of fields detected in Step 406 to determine a change in detected fields. Step 410 establishes a correspondence between change of field detected in Step 408 and a position along the conductor under test. Step 412 is a product, where the detection of a change in field indicates a short in the conductor.

In some aspects of the invention, Step 400 provides a directional detector shield. The detector shield has shield walls at least partially surrounding the detector, and has an opening in the shield walls to expose the detector. Then, Step 404 includes using the detector shield to minimizing the influence of fields on the detector when the shield walls are interposed between a field and the detector, and using the detector shield to maximizing the influence of a magnetic field on the detector when the opening is interposed between a magnetic field and the detector. Preferably, Step 404 includes the detector shield being a U-shaped channel of aluminum having inside walls adjacent the detector, outside walls, and a wall thickness greater than 0.8 mm.

In some aspects of the invention, Step 404 includes the detector shield including a pair of middle shields overlying the outside channel walls, with the middle shield material selected from the group consisting of aluminum, ferrous metal, and transformer iron, having a thickness in the range from approximately 0.4 to 0.6 mm. Also, Step 404 includes the detector shield including a pair of outer shields overlying the middle shields, with the outer shield material selected from the group consisting of aluminum, ferrous metal, and transformer iron, having a thickness in the range from approximately 0.4 to 0.6 mm. In this manner, a short in a conductor is precisely located through the use of the detector shield in conjunction with the detection of fields.

In some aspects of the invention, Step 400 provides a non-conductive spacer interposed between the detector and the detector shield mouth. Then, Step 404 includes interposing the spacer between the conductor under test and the detector. Preferably, the spacer is aligned to maintain a minimum distance in the range from 10 to 30 mm between the detector and the conductor under test. Likewise, a maximum distance of 30 to 50 mm is maintained between the sensor and the conductor under test. In this manner, an optimal spacing is maintained for the sensing of test signals on the conductor. In some aspects of the invention, the distance between the detector and the conductor under test is a minimum of approximately 17 mm and a maximum of approximately 42 mm.

A unique system and method has been provided to precisely locate the exact position of a short along a conductor, even if the conductor is co-located with other conductors, even conductors connected to low resistance loads. A combination of low frequency test pulse signals, at low duty cycles, and the use of a directional sensor made with shields, account for the accuracy and reliability of the system. The shields are arranged to optimally shield and direct signals at the transmitter test signal frequency. The shields also act to place the shorted wire an optimal distance from the sensor. Other variations and embodiments of the present invention will occur to those skilled in the art.

What is claimed is:

1. A system for detecting the location of a low resistance short in a conductor comprising:

a transmitter to generate a transmit test signal having a low duty cycle pulse, said transmitter having an output operatively connected to the conductor;

wherein a conductor magnetic field is induced by the transmit test signal;

a manipulable detector having an input to sense magnetic fields along the conductor, said detector having a output to supply a receive test signal responsive to the magnetic fields;

a receiver having an input operatively connected to the output of said manipulable detector, said receiver supplying a receiver output responsive to the receive test signal, whereby said detector is manipulated in response to the receiver output; and a directional shield having center shield walls at least partially surrounding said manipulable detector and having an opening in said shield walls to expose said manipulable detector, said directional shield minimizing the influence of magnetic fields on said manipulable detector when said directional shield walls are interposed between a magnetic field and said manipulable detector, and said directional shields maximizing the influence of a magnetic field on said manipulable detector when said opening is interposed between a magnetic field and said manipulable detector, whereby a short in a conductor is precisely located through the use of said directional shield in conjunction with the receiver output signal.

2. A system as in claim 1 in which said manipulable detector includes an inductor of approximately 10,000 micro-henries (uH) in parallel with a capacitor of approximately 0.033 microfarads.

3. A system as in claim 1 in which the transmit test signal low duty cycle pulse width generated by the transmitter has a duty cycle of greater than 0.02%.

4. A system as in claim 1 in which said directional shield includes U-shaped center shield walls, with a mouth, said center shield being shaped to locate the conductor a minimum first distance from said manipulable detector and a maximum second distance from said manipulable detector, whereby the test signal transmitted from a conductor is optimally sensed when the directional shield mouth is interposed between the conductor and said manipulable detector.

5. A system as in claim 4 in which said directional shield further includes a non-conductive spacer interposed to maintain the first minimum distance between the conductor and said manipulable detector.

6. A system as in claim 5 in which the first distance is approximately 17 millimeters (mm), and the second distance is approximately 42 mm.

7. A system as in claim 1 in which the transmit test signal low duty cycle pulse has a repetition rate in the range between 0.1 and 100 Hz.

8. A system as in claim 4 in which said directional shield center walls are selected from the group of materials consisting of aluminum, ferrous, and transformer iron, and in which said walls have a thickness greater than approximately 0.8 millimeters.

9. A system as in claim 4 further in which said shield center walls have an interior wall surface adjacent said manipulable detector and an exterior wall surface, and further comprising:
two middle shield walls each having an interior wall surface located adjacent each said exterior center wall surface, each middle shield wall also having an exterior wall surface; and
two outer shields walls each having an interior wall surface located adjacent said middle shield exterior wall surfaces.

10. A system as in claim 9 in which said middle and said outer shield walls have a thickness in the range from approximately 0.4 to approximately 0.6 mm, in which said middle and outer shield wall material is selected from the group of materials consisting of ferrous metal, aluminum, and transformer iron.

11. A method for improved accuracy in the identification of shorts in a conductor with a manipulable detector with a directional shield, the method comprising the steps of:
a) introducing a low duty cycle pulse transmit test signal to the conductor under test, whereby the conductor radiates a field in response to the test signal;
b) maintaining an optimal separation between the manipulable detector and the conductor under test, whereby the accuracy of the field readings is improved;
c) detecting a plurality of fields, radiated by the transmitter test signal in the conductor under test, in response to a corresponding plurality of positions along the conductor;
d) comparing the plurality of fields detected in Step c) to determine a change in detected fields; and
e) establishing a correspondence between change of field detected in Step d) and a position along the conductor under test, whereby the change of field indicates a short in the conductor.

12. A method as in claim 11 wherein the directional shield includes shield walls at least partially surrounding the manipulable detector and includes an opening in the shield walls to expose the manipulable detector, and in which Step b) includes using the directional shield to minimize the influence of fields on the manipulable detector when the shield walls are interposed between a field and the manipulable detector, and using the directional shield to maximize the influence of a magnetic field on the manipulable detector when the opening is interposed between a magnetic field and the manipulable detector, whereby a short in a conductor is precisely located through the use of the directional shield in conjunction with the detection of fields.

13. A method as in claim 12 wherein a non-conductive spacer is interposed between the manipulable detector and the directional shield mouth, and in which Step b) includes interposing the spacer between the conductor under test and the manipulable detector, whereby an optimal spacing is maintained for the sensing of fields emitted by the conductor.

14. A method as in claim 13 in which Step b) includes the spacer being aligned to maintain a minimum distance in the range from 10 to 30 mm between the manipulable detector and the conductor under test.

15. A method as in claim 11 in which the manipulable detector includes an inductor of approximately 10,000 uH in parallel with a capacitor of approximately 0.033 microfarads.

16. A method as in claim 11 in which Step a) includes introducing a low duty cycle pulse transmit test signal having a duty cycle of greater than 0.02%.

17. A method as in claim 11 in which Step a) includes introducing a low duty cycle pulse transmit test signal having a pulse repetition rate of approximately 2 Hz.

18. A method as in claim 12 in which Step b) includes the directional shield being a U-shaped channel of aluminum having inside walls adjacent the manipulable detector, outside walls, and a wall thickness greater than 0.8 mm.

19. A method as in claim 18 in which Step b) includes the directional shield including a pair of middle shields overlying the outside channel walls, with the middle shield material selected from the group consisting of aluminum, ferrous metal, and transformer iron, having a thickness in the range from approximately 0.4 to 0.6 mm, and in which Step b) includes the directional shield including a pair of outer shields overlying the middle shields, with the outer shield material selected from the group consisting of aluminum, ferrous metal, and transformer iron, having a thickness in the range from approximately 0.4 to 0.6 mm.

20. A closed-loop feedback system of detecting short circuits through the continuous interaction of the system with a human operator, the system comprising:
a stimulus generator creating a transmit test signal having a period of about 0.5 seconds with an and an on-time of about 85 microseconds;

a test signal radiator operatively connected to said stimulus generator and including a conductor under test shorted to ground, said test signal radiator creating a magnetic field, responsive to the transmit test signal induced in said electrical conductor under test between said stimulus generator and the short;

a directional sensor to receive the magnetic field with a first strength in a first directional orientation, and with a second strength, less than the first strength, in a second directional orientation, said directional sensor generating a field indicator signal, detectable to the human operator, in response to the strength of the received magnetic signal; and in which the operator manipulates said directional sensor with respect to said conductor under test to generate a plurality of field indicator signals corresponding to the location of said directional sensor with respect to said conductor under test, whereby the operator is able to accurately locate of the short in said conductor under test.

* * * * *